United States Patent
Yuh et al.

(10) Patent No.: US 8,217,684 B2
(45) Date of Patent: Jul. 10, 2012

(54) FAST AND ACCURATE CURRENT DRIVER WITH ZERO STANDBY CURRENT AND FEATURES FOR BOOST AND TEMPERATURE COMPENSATION FOR MRAM WRITE CIRCUIT

(75) Inventors: Perng-Fei Yuh, San Jose, CA (US); Pokang Wang, Los Altos, CA (US); Lejan Pu, San Jose, CA (US); Minh Tran, San Jose, CA (US); Chao-Hung Chang, Gilroy, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 25 days.

(21) Appl. No.: 12/925,004

(22) Filed: Oct. 12, 2010

(65) Prior Publication Data
US 2012/0086476 A1 Apr. 12, 2012

(51) Int. Cl.
*H03B 1/00* (2006.01)
(52) U.S. Cl. ........ 327/108; 327/109; 327/538; 327/541; 323/313; 323/315
(58) Field of Classification Search .......... 327/108–110, 327/112, 512, 513, 530, 534–535, 538–543; 323/312–315
See application file for complete search history.

(56) References Cited

U.S. PATENT DOCUMENTS

| | | | | |
|---|---|---|---|---|
| 5,059,890 A | * | 10/1991 | Yoshikawa et al. | 323/315 |
| 5,757,175 A | * | 5/1998 | Morishita et al. | 323/315 |
| 5,815,429 A | | 9/1998 | Sher et al. | |
| 5,939,933 A | * | 8/1999 | Wang | 327/512 |
| 7,242,242 B2 | * | 7/2007 | Bedarida et al. | 327/543 |
| 7,630,234 B2 | | 12/2009 | Sugibayashi et al. | |
| 7,948,480 B2 | * | 5/2011 | Mizuki et al. | 345/204 |
| 2004/0062117 A1 | | 4/2004 | Perner et al. | |
| 2007/0171703 A1 | | 7/2007 | Huang et al. | |
| 2009/0010044 A1 | | 1/2009 | Sakimura et al. | |
| 2009/0161423 A1 | | 6/2009 | Sugibayashi et al. | |
| 2009/0237988 A1 | | 9/2009 | Kurose et al. | |

OTHER PUBLICATIONS

P. Allen and D. Holberg, "CMOS Analog Circuit Design," HRW Series in Electrical and Computer Engineering, Copyright 1987 by Saunders College Publishing, pp. 240-251.
PCT Search Report PCT/US11/01734—Mailed Mar. 1, 2012, Magic Technologies, Inc.
"Design Considerations for MRAM," by T. M. Maffitt et al., IBM J. Res. & Dev. vol. 50, No. 1, Jan. 2006, pp. 25-39.

* cited by examiner

*Primary Examiner* — An Luu
(74) *Attorney, Agent, or Firm* — Saile Ackerman LLC; Stephen B. Ackerman

(57) ABSTRACT

Systems and methods for realizing current drivers without current or voltage feedback for devices that require accurate current drive with zero standby current has been disclosed. In a preferred embodiment of the invention this current driver is applied for write circuits for MRAMs. A fast and accurate reference current is generated by diode voltage divided by resistor without any feedback. The diode current is not fed back from the reference current. The diode current is generated from a regulated voltage. Temperature compensation of the write current is inherently built in the diode current reference. Fine-tuning of the temperature coefficient is achieved by mixing poly and diffusion resistors. A switch inserted in the current driver can turn on the driver fast and without a need for standby current. Leading boost in the current driver can fast charge the large coupling capacitance of word and bit lines and speed up write timing.

40 Claims, 3 Drawing Sheets

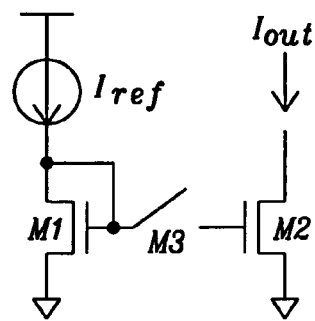
*FIG. 1a - Prior Art*
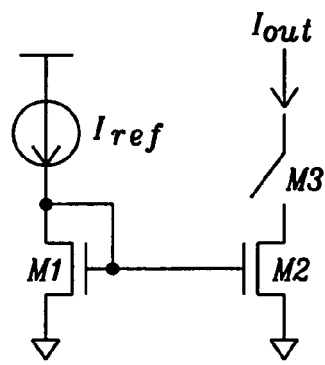
*FIG. 1b - Prior Art*
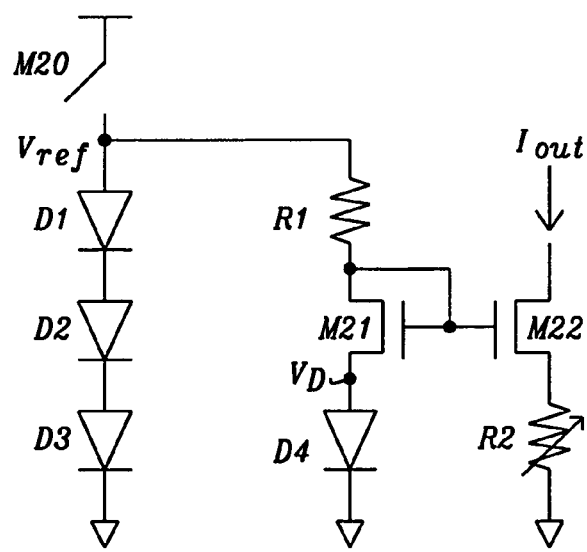
*FIG. 2*

FAST AND ACCURATE CURRENT DRIVER WITH ZERO STANDBY CURRENT AND FEATURES FOR BOOST AND TEMPERATURE COMPENSATION FOR MRAM WRITE CIRCUIT

BACKGROUND (1) Field of the Invention

This invention relates generally to Magnetic Random Access Memories (MRAM) and relates more specifically to current driver design for write circuits of MRAM using Magnet Tunnel Junction (MTJ).

(2) Description of the Prior Art

In order to write the MTJ cells in a field MRAM, external magnetic field is applied in the x and y direction parallel to the tunnel junction. In practice, the magnetic field is generated by currents flowing in the word line and the bit line of the memory array. The lower boundary of the current is set to guarantee all MTJ cells can be written (full select requirement), while the upper boundary is set to guarantee that other cells in the same bit line are not written (half select requirement). Therefore, accurate current is required for the bit line or the word line current drivers.

FIG. 1a+b prior art show the conventional way to generate accurate current using current mirrors. It consists of three transistors. M1 is a reference transistor where its drain and gate are connected.

M2 is the output transistors with the same gate bias as M1. The reference current is generated from bandgap or other current references which are usually in DC or are slow due to accuracy and feedback. The current driver can be achieved by inserting a switch in the gate or the drain of the output transistor. A simple switch can be implemented using another transistor M3. When the switch is closed, the gate voltage is disturbed by the charge sharing of the gate capacitor in FIG. 1a prior art, or by voltage increase in the channel of the output transistor in FIG. 1b prior art. In both cases, the settling time of the output current is approximate Cg/gm, where Cg is the total gate capacitance of the two transistors M1 and M2 and gm is the trans-conductance of the reference transistor M1. We can see that Cg must be small and gm must be big to achieve high speed. However, Cg is usually big to reduce mismatch and to achieve larger multiplication factor of current amplification. The only way to achieve high speed and maintain accuracy is to increase gm, which implies increasing reference current. The reference current contributes to the standby current of MRAM chip. Typical standby current for our previous 4M-bit MRAM chip is on the order of 10 mA, mostly for the reference current of the write circuit.

It is a challenge for engineers to design a fast and accurate current driver.

There are known patents or patent publications dealing with write circuits for MRAMs.

U.S. Patent Publication (US 2007/0171703 to Huang et al.) proposes a current source for magnetic random access memory (MRAM), including a band-gap reference circuit, a first stage buffer, and a plurality of second stage buffers. The band-gap reference circuit provides an output reference voltage, which is locked by the first stage buffer. The plurality of second stage buffers generate a stable voltage in response to the locked voltage, so as to provide a current for the conducting wire after being converted, such that magnetic memory cell changes its memory state in response to the current. The current source may reduce the discharge time under the operation of biphase current, so as to raise the operating speed. Further, the circuit area of the current source for the MRAM is also reduced. The operation of multiple write wires may be provided simultaneously to achieve parallel write.

U.S. Patent Publication (US 2009/0237988 to Kurose et al.) discloses a magnetic memory device including a plurality of word lines, a plurality of bit lines arranged to intersect with the word lines, an MRAM cell array including a plurality of magnetic random access memory (MRAM) cells arranged at intersection portions between the word lines and the bit lines, a read current source which supplies a read current to the MRAM cells in a read mode, a sense amplifier which detects terminal voltages of the MRAM cells generated by the read current to generate a detection output signal, a latch circuit which latches the detection output signal to output read data, and a data write circuit which supplies a write current to the MRAM cells depending on write data in a write mode to perform writing and which supplies the write current to the MRAM cells depending on the read data in the read mode to perform rewriting.

U.S. Patent Publication (US 2009/0161423 to Sugibayashi et al.) discloses an MRAM having a first cell array group and a second cell array group containing a plurality of cell arrays. Each of the first cell array group and the second cell array group includes a first current source unit for supplying a first write current IWBL to a bit line WBL of the cell array and a first current waveform shaping unit having a first capacitor requiring precharge and shaping the waveform of the first write current IWBL. When the cell array performs write into a magnetic memory, the first current waveform shaping unit of the first cell array group and the first current waveform shaping unit of the second cell array group charges and discharges electric charge accumulated in the first capacitor to wiring toward the bit line WBL at different periods from each other.

Furthermore the following publication is dealing with current reference circuits:

P. Allen and D. Holberg, "CMOS Analog Circuit design", Oxford University Press.

SUMMARY

A principal object of the present invention is to achieve fast and accurate current drivers for MRAMs.

A further object of the invention is to achieve current drivers based on diode or bipolar voltage reference divided by resistors.

A further object of the present invention is to achieve current drivers without current or voltage feedback.

A further object of the present invention is to achieve current drivers providing output current which are insensitive to power supply variation.

A further object of the present invention is to achieve current drivers without requiring stand-by current.

Moreover an object of the present invention is to achieve a temperature compensation of the write current inherently built-in a diode current reference.

In accordance with the objects of this invention a method to a fast and accurate current driver without current or voltage feedback for devices that require accurate current drive with zero standby current has been achieved. The method invented comprises, firstly, the steps of: (1) providing a power supply, a switch, a first rectifying means, a diode connected transistor, one or more trimmable resistors, and a second rectifying means, (2) turning ON the current driver by the switch without a need for stand-by current, and (3) generating a stable reference voltage, which is insensitive to power supply voltage variation. Furthermore the method invented comprises: (4) generating a stable first reference current by connecting a resistor to said reference voltage, and (5) deploying a diode connected transistor and the second rectifying means in series in the path of the stable first reference current. Finally the method comprises the steps of: (6) mirroring said stable reference current to a second reference current, and (7) fine-tuning said second reference current by adjusting one or more trimmable resistors; and (8) using the second reference current as write current.

In accordance with the objects of this invention a fast and accurate current driver without current or voltage feedback for devices that require accurate current drive with zero standby current has been disclosed. The current driver invented comprises, firstly: a first switch, wherein a first terminal is connected to a supply voltage and a second terminal is connected to a first terminal of a first rectifying means, said first rectifying means connected between said second terminal of said first switch and ground, and a first resistive means connected between said first terminal of the first rectifying means and a drain of a first transistor. Furthermore the current driver comprises said first transistor having its source connected to a first terminal of a second rectifying means, its drain is connected to its gate and the gate is connected to a gate of a second transistor, said second rectifying means having its second terminal connected to ground, said second transistor having its drain connected to an output node of the current driver and its source connected to a first terminal of a trimmable means of resistance, and, finally, said trimmable means of resistance having its second terminal connected to ground.

BRIEF DESCRIPTION OF THE DRAWINGS

In the accompanying drawings forming a material part of this description, there is shown:

FIG. 1a prior art shows the conventional way to generate accurate current using current mirrors, wherein a switch is deployed between the gates of both reference and output transistor.

FIG. 1b prior art shows the conventional way to generate accurate current using current mirrors, wherein a switch is deployed in the drain of the output transistor FIG. 2 shows a circuit invented for a fast and accurate current driver for MRAM.

DESCRIPTION OF THE PREFERRED EMBODIMENTS

Figure 3A:
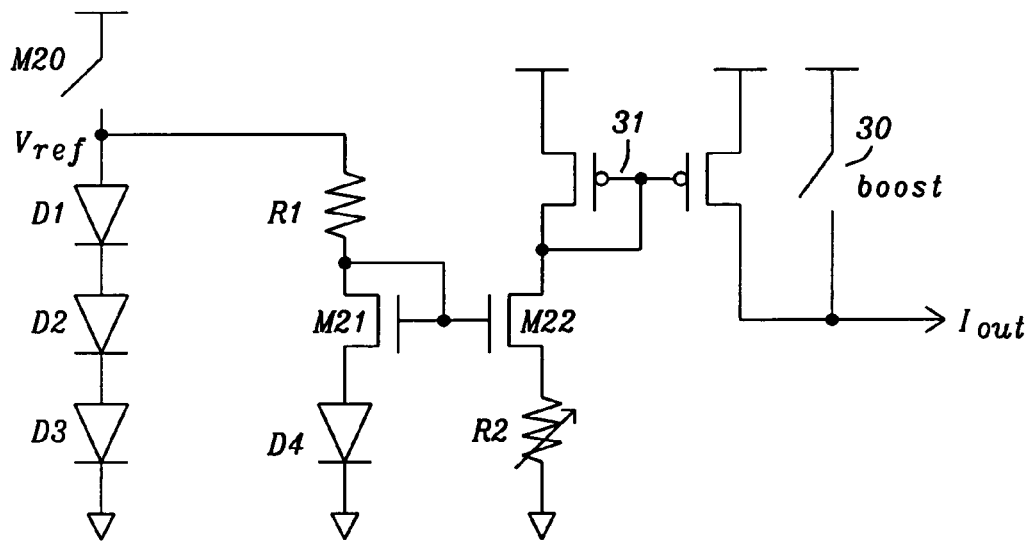
FIG. 3a shows a second embodiment of the invention comprising a current driver with a boost circuit.

Two preferred embodiments of the present invention to provide fast and accurate current drivers for write circuits in Magnetic Random Access Memories (MRAM) using Magnetic Tunnel Junction (MTJ) are disclosed. The drivers are based on diode or bipolar voltage reference divided by resistors without current or voltage feedback. The invention achieves fast and accurate current output with zero standby current, which was previously not done using current reference and current mirror structures. The boost and temperature compensation features associate with the design also enhance the write performance of MRAM chips.

It should be noted that the invention could be used for other applications/devices that require accurate current drive with zero standby current. It's not limited to MRAM.

FIG. 2 shows a circuit invented for a fast and accurate current driver. A switch M20 connecting in a preferred embodiment three diodes D1, D2, and D3 in series generates a reference voltage Vref, which is insensitive to power supply voltage. It has to be noted that alternatively two diodes or more than three diodes could be used as well. Also alternatively the two or more diodes could be replaced by diode connected transistors or other rectifying means. Furthermore it is to be also noted that a resistor or another resistive means can be inserted between the power supply and the switch M20, or between the switch M20 and Vref to provide better voltage regulation.

In order to generate a stable first reference current this reference voltage Vref is then fed to a resistor R1 and a diode connected NMOS M21 and a diode or diode connected bipolar transistor D4 to generate a gate voltage connecting to NMOS M22. The rectifying means D4 could alternatively be implemented by more than one diode or diode connected transistor. The source of M22 connects to trimmable resistor R2. The current $I_{Ref2}$ through resistor R2 can be expressed as $$I_{Ref2} = (V_D + (V_{GS1} - V_{GS2}))/R2,$$

wherein $V_D$ is the voltage drop of diode D4, $V_{GS1}$ is the gate-source voltage of transistor M21 and $V_{GS2}$ is the gate-source voltage of transistor M22.

The current $I_{Ref2}$ can be used as write current.

Since the reference voltage Vref, generated by the three series diodes, is relatively insensitive to power supply variation, the current in the diode D4 is even more insensitive to power supply variation too.

The nonlinear current/voltage (IV) relation of diodes will make $V_D$ even less sensitive to power supply. The $V_{GS1}$-$V_{GS2}$ term depends only on current, which is also not sensitive to power supply variation. We thus have a reference current flowing in R2 which is insensitive to power supply variation. It is also insensitive to transistor threshold variation because it is cancelled in the $V_{GS1}$-$V_{GS2}$ term. However it is sensitive to $V_D$ and R2 variations. One or more trimmable resistors are used for R2 to adjust the reference current to desired value. It is also sensitive to temperature variation. The diode voltage $V_D$ drops when temperature increases. However, this is an advantage for MTJ memory. The required MTJ write current decreases when temperature increases. This means that a temperature compensation of the write current is inherently built in the diode current reference. By choosing proper type of resistance (combination of poly and diffusion resistors) the temperature coefficient can be adjusted, i.e. fine-tuned, to a desired value.

It should be noted that in prior art, when a diode is used for current reference the diode current reference usually uses feedback and requires a startup circuit. This makes the startup of the reference current relatively slow. The circuit of the present invention does not use feedback. Once the switch M20 is on, large current flows to the diodes. It generates stable voltage on top of the resistor and thus a stable reference current. Everything in our circuit is feed-forward and the startup speed is much faster than in prior art. The startup time is also determined by C/gm as in the current mirror case. But large gm can be used because there is no standby current when the switch turns off.

Figure 3B:
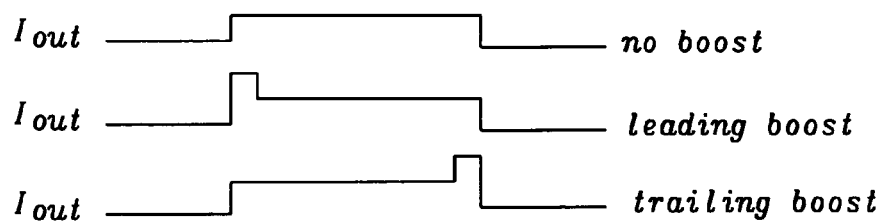
FIG. 3b illustrates the output current IOUT in three cases, a first case with no boost, a second case with a leading boost, and a third case with a trailing boost.

FIG. 3a shows a second embodiment of the invention comprising a current driver with a boost circuit. The coupling capacitance of the word line and bit line is about 30 pF. Long charging time of this coupling capacitance slows down the write speed. The second embodiment discloses to add a boost circuit to the embodiment shown in FIG. 2. The boost circuit boosts the initial current that charges the coupling capacitor. A short pulse is applied to the boost circuit at the front or the end of the write pulse. The boost current is summed to the driver current. There is no overshoot on the word line current because the maximum current is limited by the gate voltage of a NMOS transistor at the end of the word line. This makes the word line current turn on very fast. A leading boost in the current driver, as shown in FIG. 3a, can fast charge the large coupling capacitance of the MRAM word line and bit line and can speed up the write timing. A trailing boost can have also speed up write speed. FIG. 3b shows timing chart to illustrate timing for leading and trailing boost. The timing chart of FIG. 3b verifies the enhancement of write timing using the boost circuit. The boost circuit is simply a switch added via a current mirror to the main current driver of the first embodiment as shown in FIG. 3a. FIG. 3b illustrates the output current IOUT in three cases, a first case with no boost, a second case with a leading boost, and a third case with a trailing boost.

Figure 4:
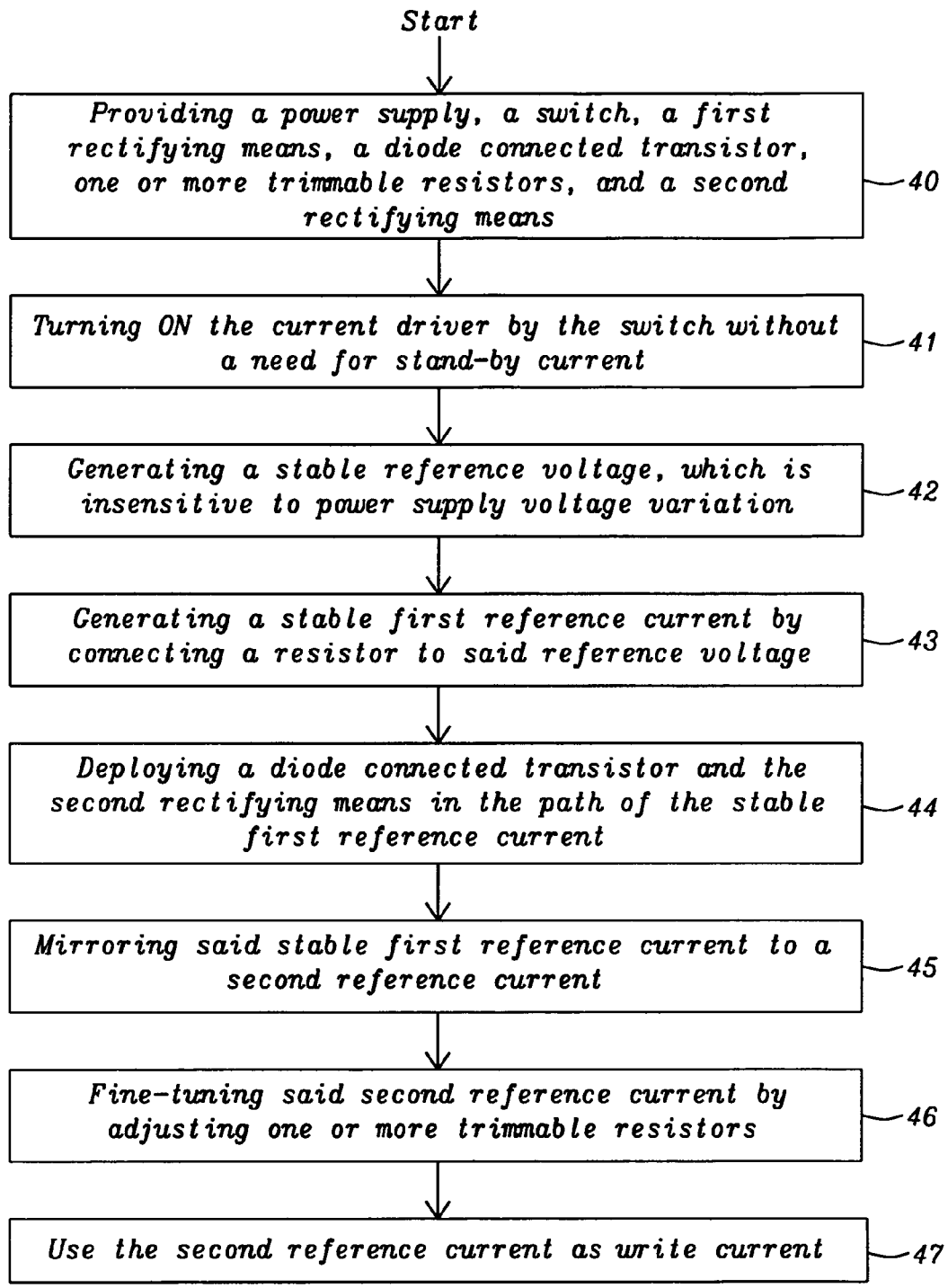
FIG. 4 illustrates a flowchart of a method invented to achieve a fast and accurate current driver without current feedback for devices that require accurate current drive with zero standby current.

FIG. 4 illustrates a flowchart of a method invented to achieve a fast and accurate current driver without current or voltage feedback for devices that require accurate current drive with zero standby current.

Step 40 of the method of FIG. 4 illustrates the provision of a power supply, a switch, a first rectifying means, a diode connected transistor, one or more trimmable resistors, and a second rectifying means. Step 41 illustrates turning ON the current driver by the switch without a need for stand-by current. Step 42 describes generating a stable reference voltage, which is insensitive to power supply voltage variation. Step 43 illustrates generating a stable first reference current by connecting a resistor to said reference voltage. Step 44 depicts deploying the diode-connected transistor used for mirroring and the second rectifying means in series in the path of the stable first reference current. Step 45 illustrates mirroring said stable first reference current to a second reference current; step 46 discloses fine-tuning said second reference current by adjusting one or more trimmable resistors and step 47 discloses using the second reference current as write current.

While the invention has been particularly shown and described with reference to the preferred embodiments thereof, it will be understood by those skilled in the art that various changes in form and details may be made without departing from the spirit and scope of the invention.

What is claimed is:

1. A method to achieve a fast and accurate current driver without current or voltage feedback for devices that require accurate current drive with zero standby current, comprising the following steps:
   (1) providing a power supply, a switch, a first rectifying means, a diode connected transistor used for mirroring, one or more trimmable resistors, and a second rectifying means;
   (2) turning ON the current driver by the switch without a need for stand-by current;
   (3) generating a stable reference voltage, which is insensitive to power supply voltage variation;
   (4) generating a stable first reference current by connecting a resistor to said reference voltage;
   (5) deploying the diode connected transistor used for mirroring and the second rectifying means in series in the path of the stable first reference current;
   (6) mirroring said stable reference current to a second reference current;
   (7) fine-tuning said second reference current by adjusting one or more trimmable resistors; and
   (8) using the second reference current as write current.

2. The method of claim 1 wherein said device requiring accurate current drive is a Magnetic Random Access Memory (MRAM).

3. The method of claim 1 wherein said switch is a transistor.

4. The method of claim 1 wherein said stable reference voltage is generated by said first rectifying means.

5. The method of claim 4 wherein said stable reference voltage is generated by one or more diodes, wherein, if more than one diode is deployed, these diodes are connected in series.

6. The method of claim 4 wherein three diodes are deployed to generate the stable reference voltage.

7. The method of claim 4 wherein said stable reference voltage is generated by one or more diode connected transistors, wherein, if more than one diode connected transistor is deployed, these transistors are connected in series.

8. The method of claim 1 wherein said diode connected transistor used for mirroring is a NMOS transistor.

9. The method of claim 1 wherein said second rectifying means is one or more diodes in series.

10. The method of claim 1 wherein said second rectifying means is one or more diode connected bipolar transistors.

11. The method of claim 1 wherein types of the trimmable resistors are selected to adjust a temperature coefficient of these resistors to a value desired.

12. The method of claim 11 wherein a combination of poly and diffusion trimmable resistors is deployed.

13. The method of claim 1 wherein a boost circuit is connected to the second reference current in order to boost an initial current that charges a coupling capacitance of memory word lines and bit lines.

14. The method of claim 13 wherein said boost circuit is connected to the second reference current via a current mirror.

15. The method of claim 13 wherein the boost circuit comprises a switch connecting the power supply to the write current.

16. The method of claim 13 wherein a boost pulse is added to a frond-end of a write pulse.

17. The method of claim 13 wherein a boost pulse is added to a back end of the write pulse.

18. A fast and accurate current driver without current or voltage feedback for devices that require accurate current drive with zero standby current comprises:
   a first switch, wherein a first terminal is connected to a supply voltage and a second terminal is connected to a first terminal of a first rectifying means;
   said first rectifying means wherein its first terminal is connected to said second terminal of said first switch and its second terminal is connected to ground;
   a first resistive means connected between said first terminal of the first rectifying means and a drain of a first transistor;
   said first transistor having its source connected to a first terminal of a second rectifying means, its drain is connected to its gate and the gate is connected to a gate of a second transistor;
   said second rectifying means having its second terminal connected to ground;
   said second transistor having its drain connected to an output node of the current driver and its source connected to a first terminal of a trimmable means of resistance; and
   said trimmable means of resistance having its second terminal connected to ground.

19. The current driver of claim 18 wherein said device requiring accurate current drive is a MRAM.

20. The current driver of claim 18 wherein said first switch is a transistor.

21. The current driver of claim 18 wherein said first rectifying means comprises one or more diodes, wherein, if more than one diode is deployed, these diodes are connected in series.

22. The current driver of claim 21 wherein said first rectifying means comprises two or more diode connected transistors.

23. The current driver of claim 18 wherein said first resistive means comprises a resistor.

24. The current driver of claim 18 wherein said first transistor comprises a NMOS transistor.

25. The current driver of claim 18 wherein said second rectifying comprises one or more diodes, wherein, if more than one diode is deployed, these diodes are connected in series.

26. The current driver of claim 18 wherein said second rectifying comprises one or more diode-connected bipolar transistors, wherein, if more than one diode-connected bipolar transistors are deployed, these bipolar transistors are connected in series.

27. The current driver of claim 18 wherein said second transistor is a NMOS transistor.

28. The current driver of claim 18 wherein said trimmable means of resistance are trimmable resistors.

29. The current driver of claim 18 wherein said trimmable resistors have a temperature coefficient adapted to a temperature coefficient of a MTJ memory.

30. The current driver of claim 29 wherein said trimmable resistors comprise a combination of different types of resistors.

31. The current driver of claim 30 wherein said trimmable resistors comprise a combination of poly resistors and diffusion resistors.

32. The current driver of claim 18 wherein a boost circuit is connected to the current driver.

33. The current driver of claim 32 wherein said boost circuit is connected to the drain of the second transistor via a current mirror.

34. The current driver of claim 33 wherein said boost circuit can add a boost pulse to a write pulse of the current driver via a switch having its first terminal connected to the supply voltage and its second terminal connected to the output node of the current driver.

35. The current driver of claim 34 wherein the boost pulse is added to a frond-end of a write pulse.

36. The current driver of claim 34 wherein the boost pulse is added to a back-end of a write pulse.

37. The current driver of claim 18 wherein a resistive means is deployed between the supply voltage and the first terminal of the first switch.

38. The current driver of claim 37 wherein said resistive means is a resistor.

39. The current driver of claim 18 wherein a resistive means is deployed between said second terminal of the first switch and said first terminal of the first rectifying means.

40. The current driver of claim 39 wherein said resistive means is a resistor.

* * * * *